United States Patent [19]

Compton

[11] Patent Number: 4,680,557

[45] Date of Patent: Jul. 14, 1987

[54] STAGGERED GROUND-PLANE MICROSTRIP TRANSMISSION LINE

[75] Inventor: Peter M. Compton, Aloha, Oreg.

[73] Assignee: Tektronix, Inc., Beaverton, Oreg.

[21] Appl. No.: 725,450

[22] Filed: Apr. 22, 1985

[51] Int. Cl.$^4$ ............................................. H01P 3/08
[52] U.S. Cl. ........................................ 333/1; 333/238;
174/117 FF; 174/36
[58] Field of Search .......................... 333/1, 238, 246;
174/117 F, 117 FF, 117 PU, 36

[56] References Cited

U.S. PATENT DOCUMENTS

| | | | |
|---|---|---|---|
| 2,958,120 | 11/1960 | Taylor | 174/68.5 X |
| 3,543,198 | 11/1970 | Stopper | 174/36 X |
| 3,764,727 | 10/1973 | Balde | 333/238 X |
| 3,876,964 | 4/1975 | Balastar et al. | 333/238 |

Primary Examiner—Eugene R. LaRouche
Assistant Examiner—Benny T. Lee
Attorney, Agent, or Firm—William O. Geny; Robert S. Hulse

[57] ABSTRACT

A microstrip transmission line comprises a plurality of signal-carrying lines disposed along a dielectric ribbon and separated by a predetermined spacing. Ground-plane conductors are disposed on the opposite side of the ribbon in staggered relation to the signal-carrying lines such that the ground-plane conductors occupy spaces corresponding to the gaps between adjacent signal-carrying lines. This arrangement lowers the capacitance and raises the impedance of the transmission line while maintaining high signal line density.

3 Claims, 7 Drawing Figures

STAGGERED GROUND-PLANE MICROSTRIP TRANSMISSION LINE

BACKGROUND OF THE INVENTION

The following invention relates to electrical transmission lines and particularly to microstrip transmission lines for making electrical connections between microprocessor-based systems in which the transmission line comprises a plurality of signal-carrying lines and two or more ground planes arrnaged on a trip of dielectric material.

Microprocessor-based systems such as computers or microprocessor emulators are often connected to each other by means of transmission lines which consist of a flat strip or ribbon of dielectric material supporting a large plurality of signal-carrying lines on one side of the ribbon and a ground-plane conductor on the other side. Typical ribbon signal-carriers of this type have high signal path denstites and may include 20 or more signal lines connecting the various I/O pins on respective microprocessor or integrated chip semiconductor elements.

With such lines it is important that the characteristic impedance $Z_0$ be made to match the terminating impedance at the output of the transmission line. Such impedances usually range from 50 to 132 ohms. If the transmission line impedance does not match the terminating impedance of the input device, at the transmission line ouptput a portion of the electrical signal carried by the transmission line will be reflected at the interface between the line and the input. This reflection will distort or alter the signal carried by the transmission line, resulting in either attenuation of the signal amplitude or distortion of the waveform. This problem is particularly acute for high-frequency devices such as microprocessors that generate digital pulses having extremely fast rise times and operate at bandwidths in the 300-megahertz to 1-gigahertz range and higher. Reflection of the transmitted signal can alter the shape of the waveforms at these frequencies to the extent that binary information is lost.

A major component of this problem is that the characteristic impedance depends in part upon the capacitance between the signal paths and the ground plane. Typically for impedances in the 50-ohm range and for a transmission line having a high signal path densisty, the capacitance has been too high to transmit the aforementioned high frequency signals without considerable distortion of the waveform. This alters the shape of the pulse, causing its leading and trailing edges to lose definition. These pulse are intended to be square waves, but the line capacitance frequently distorsts the wave and converts it to a more rounded shape.

In the past, various geometries have been proposed for transmission lines in order to provide the necessary characteristic impedance. The most conventional type of transmission line includes a dielectric ribbon or strip of a predetermined width carrying a plurality of signal lines arranged in parallel along one side of the strip, and having a wide ground plane, substantially occupying the width of the strip, disposed on the other side. In yet another configuration, signal-carrying lines may be sandwiched between two dielectric ribbons which have ground-plane conductors disposed on the outsides of both ribbons. Such transmission line structures are shown in a text published by Motorola Semi-Conductor Products, Inc. entitled *MECL System Design Handbook* by William R. Blood, Jr.

SUMMARY OF THE INVENTION

The present invention privides a microstrip transmission line capable of carrying a high density of signal-carrying lines on a conventionally sized dielectric ribbon while at the same time providing a high impedance and low distortion connecting link between high-frequency microprocessor-based systems. Pulses having sharp leading and trailing edges may be transmitted over the line with little or no distortion.

A plurality of signal-carrying leads consisting of thin strips of conducting metal such as copper are aligned parallel to each other on one side of a ribbon of dielectric material. The strips are attached to the dielectric material according to processes which are well known in the art. The strips are spaced apart by a predetermined distance. A plurality of ground-plane conductors are disposed in parallel fashion on the underside of the dielectric ribbon. Each ground-plane line has a width that approximately corresponds to the dimension of the gaps between the signal-carrying conductors, and the positions of the ground-plane lines are staggered so that they are vertically aligned with the gaps between the signal-carrying lines on the upper side of the dielectric ribbon. In this instance the term "vertical" refers to a direction substantially perpendicular to the plane of the dielectric ribbon. Thus, the signal-carrying lines may be thought of as extending along the top of the ribbon and the ground-plane conductors may be viewed as extending along the bottom surface of the ribbon. For the most effective signal path density versus reactive constituent the width of each of the individual signal-carrying lines should be exactly equal to the interline spacings between them and the respective edges of the ground-plane conductors and signal-carrying lines should be vertically congruent.

The result of the foregoing microstrip construction is that the capacitance between the signal-carrying lines and the ground-plane lines becomes significantly lower than in the case of a conventional microstrip, raising the characteristic impedance of the microstrip. The inductance of the microstrip is also lowered; however, the decrease in capacitance is much greater than the decrease in inductance resulting in an overall increase of the characterstic impedance.

It is an object of this invention to provide a high-frequency microstrip transmission line capable of carrying a high density of signal-carrying lines on a conventionally sized strip of dielectric material with minimal distortion and low signal attenuation.

Yet a further object of this invention is to provide a microstrip transmission line having minimal capacitnace.

A still further object of this invention is to provide a microstrip transmission line having a high characteristic impedance with low capacitive and inductive reactance.

The foregoing and other objectives, features and advantages of the present invention will be more readily understood upon consideration of the following detailed description of the invention taken in conjunction with the accompanying drawings.

DETAILED DESCRIPTION OF THE INVENTION

Figure 1:
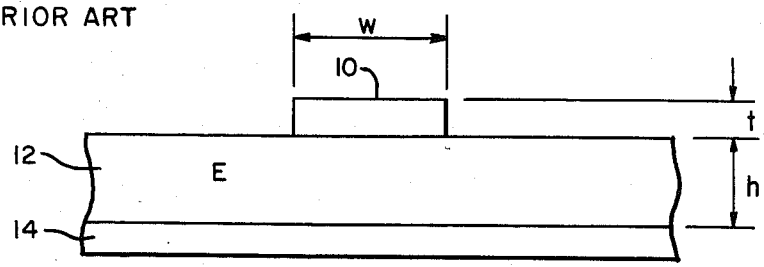
FIG. 1 is a cross-sectional view of a conventional microstrip transmission line.

A conventional microstrip transmission line as shown in FIG. 1 includes a signal path 10 having a known width W and a thichness t which occupies one side of a circuit carrier 12. The circuit carrier 12 is a strip or ribbon of dielectric material of a known thickness h and having a dielectric constant E. The signal path 10 is disposed atop the dielectric strip 12 and on the underneath of the dielectric strip 12 a conductive ground plane 14 is attached. This structure may be modeled as an elongate capacitor having a capacitance C where the signal path 10 constitutes one capacitor plate and the ground plane 14 constutes a second capacitor plate. The circuit carrier 12 constitutes a dielectric fill between the capacitive plates. The capacitance C between any point on the signal line 10 and the ground plane 14 varies inversely with the distance between those points. In practice it has been determined that the capacitance is negligible, in terms of effect on characteristic impedance, from any point on the signal path 10 to a point on the ground plane 14 that is farther away than one width W of the signal path 10. Thus, any ground plane which is wider than 3W can be considered essentially an infinite ground plane.

With this structure, the characteristic capacitance is equal to the permittivity of the dielectric times the combined area of the capacitive plates divided by the thickness between the plates. Typically, the width of the signal-carrying strip 10 is on the order of 0.01 inches an dielectric ribbon is 0.005 inches thick. The dielectric constant of dielectric material typically used as a circuit carrier such as ribbon 12 has a dielectric constant of 3.5. If the length of the ribbon is arbitrarily chosen to be 1 foot for the purposes of calculation, the characteristic capacitance for the structure of FIG. 1 turns out to be 37.85 pF per foot.

Figure 2:
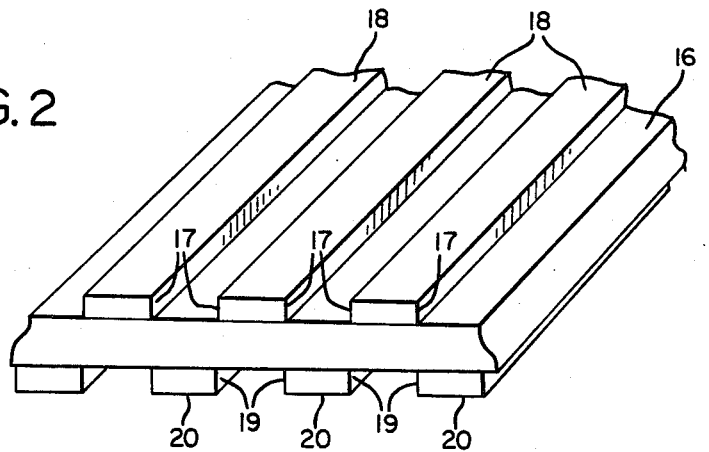
FIG. 2 is prospective drawing of a portion of a microstrip transmission line constructed according to the present invention.
Figure 3:
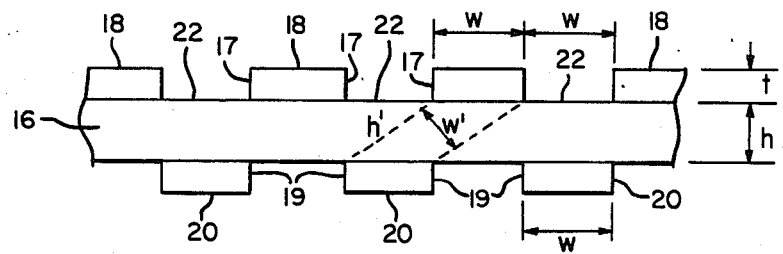
FIG. 3 is an end view of the microstrip transmission line shown in FIG. 2.

Referring now to FIG. 2, a circuit carrier 16 having a dielectric constant similar to that of circuit carrier 12 contains a plurality of parallel elongate signal lines 18 disposed on one side of the circuit carrier 16. As shown in FIG. 3, the signal lines 18 have a width of W and are equally spaced apart by a width W. On the opposite side of the carrier 16 a plurality of ground-plane lines 20 are arranged in staggered relation to the signal lines 18 so that the ground lines 20 are disposed directly beneath the interline gaps 22 separating the signal lines 18. The edges 17 of signal lines 18 are approximately congruent with the respective edges 19 of ground-plane lines 20.

With the staggered geometry of FIG. 2 the capacitance between the ground-plane lines 20 and the signal-carrying lines 18 is significantly lowered. In this case the effective width of the capacitive plates become W' which is indicated as the distance between the dotted lines joining any one of the signal-carrying lines 18 and either of its next adjacent ground-plane lines 20. The effective thickness of the dielectric strip 16 is also larger, being substantially equal to the length of the dotted line joining a point on the signal-carrying line 18 and its corresponding ground-plane line 20. Using the same analysis as that conducted for the structure of FIG. 1, the effective plate width drops from 0.02 inches (2W) to about 0.009 inches (2W') yielding lower coupled capacitances. The capacitance is further lowered because the coupling path h' is lengthened from 0.005 inches to 0.011 inches. This drops the characteristic capacitance $C_0$ from 37.85 pF per foot to 4.417 pF per foot. There will be adjacent signal path couplings as well as the couplings between signal lines 18 and ground planes 20; however, the signal path couplings will be identical in both the standard microstrip of FIG. 1 and staggered geometry of FIG. 2.

Figure 3A:
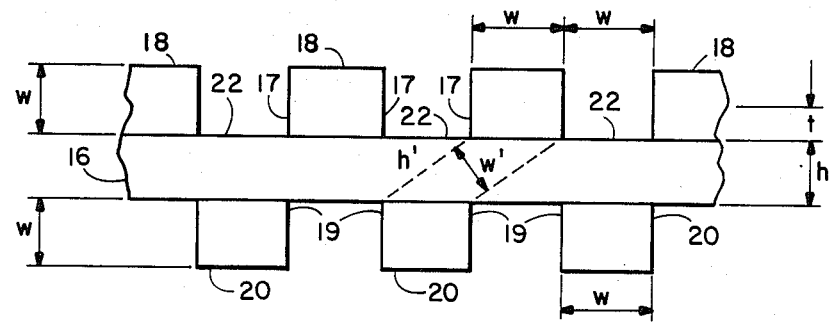
FIG. 3A is an end view of a microstrip transmission line constructed according to the geometric configuration of FIG. 3 but having conductors with a square cross-sectional area.

Theoretically, the capacitance is lowest when $W \leq t$, that is, when the signal lines 18 have a square or vertically rectangular cross section. In such a case the ground-plane lines should also have a square or vertically rectangular cross sectional area equal to $W^2$. FIG. 3(a) shows such a configuration. This figure is identical to the embodiment in FIG. 3 except that the signal lines 18 and the ground plane lines 20 now have a height W as well as a width W. Thus the cross-sectional area of each is $W^2$.

Empirical studies which are discussed in the *MECL Systems Design Handbook* have confirmed that the characteristic impedance of a transmission line rises to some definite multiple of its infinite plane value When the width of ground plane falls belwo three signal path widths. The same studies have also shown that the characteristic impedance rises when the infinite ground plane is altered so that the plane begins at an edge of the circuit forming the signal path and no plane resides under the signal path. Thus, the characteristic impedance of the structure of FIG. 2 may be calculated using the classical formula for calculating the characteristic impedance of the construction of FIG. 1, mofified by the reslusts of the empirical studies referred to above.

The characteristic impedance $Z_0$ of a microstrip transmission line of the type illustrated in FIG. 1 is:

$$Z_0 = \frac{87}{\sqrt{E + 1.41}} \ln\left[\frac{5.98\,h}{.8\,W + t}\right] \tag{1}$$

For 1 ounce copper where t equals 0.0014 inches, and for other values which are the same as those used to calculate the capacitance, above, the characteristic impedance is approximately 51.2 ohms.

Figure 4:
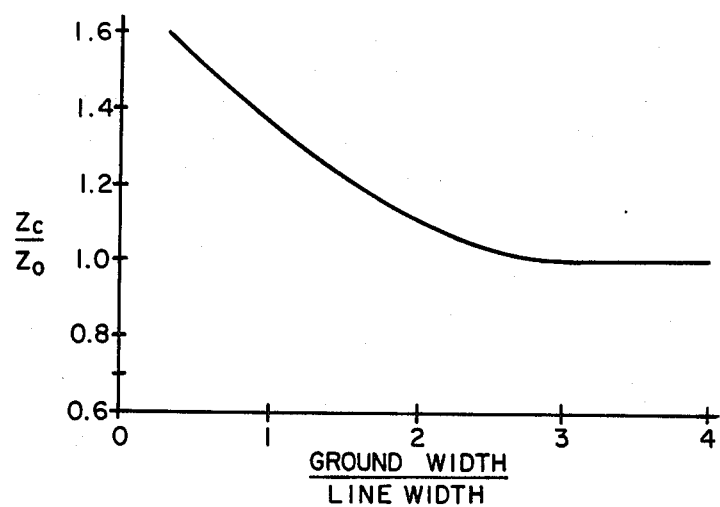
FIG. 4 is a graph depicting the effect on characteristic impedance of a decrease in the width of the ground plane.
Figure 5:
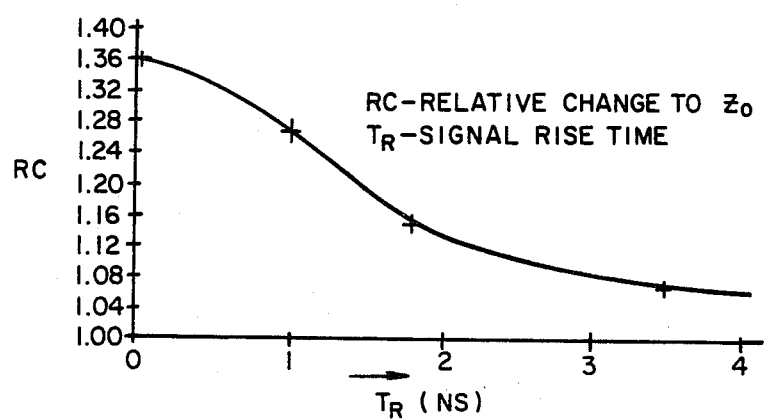
FIG. 5 is a graph depicting the effect on characteristic impedance of fast rise time pulses where the fround plane is not directly beneath the signal-carrying line.

This figure may be modified based upon the empirical studies referrd to above to determine the charactristic impedance of the staggered transmission line of FIG. 2. As shown in FIG. 4, the ratio of the characteristic impedance of a transmission line with a limited ground-plane width to the characteristic impedance of a transmission line with an infinite ground-plane width depends upon the relative widths of both. Where, as here, the ratio of effective signal line to ground plane width is 0.9, the ratio of characteristic impedances is 1.4 and this figure may then be multiplied by the value of characteristic impedance determined from equation (1) above. This yields a characteristic impedance of 71.7 ohms. Moreover, assuming that the system is driven with pulses that have a relatively fast rise time, for example, 1 nanosecond, similar studies in the *MECL Systems Design Handbook* have determined that where the ground plane lies adjacent to but not directly under the signal path, there is a relative change in characteristic impedance as a function of the rise time. Referring to the chart of FIG. 5, which is derived from those studies at pages 138-140 of the above text this relative change takes the form of a multiplicative factor which in this case turns out to be 1.27 for a rise time of 1 nanosecond. Multiplying this figure times the altered impedance above yields a characteristic impedance of 91 ohms for the staggered geometry of FIGS. 2 and 3 for pulse having a rise time of 1 nanosecond.

Another important characteristic of the staggered geometry transmission line is that the characteristic inductance of the line also falls. The characteristic inductance may be found from the formula $L = Z^2C$. If Z equals 91 ohms and C equals 4.417 pF per nanohenrys per foot. For the microstrip transmission line of FIG. 1, applying the same formula will yield 99.2 nanohenrys per foot.

Figure 6:
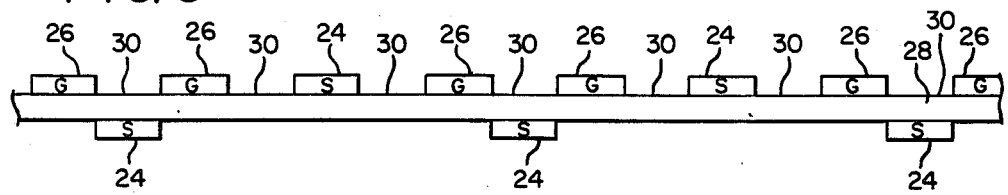
FIG. 6 is an end cutaway view of an alternative embodiment of the invention.

Alternatives to the structure of FIGS. 2 and 3 are shown in FIG. 6. In FIG. 6 the signal paths 24 are interspersed with ground planes 26 on both sides of the circuit carrier 28. The gaps 30 between the adjacent ground or signal paths have a spacing which is equal to the width of the signal paths 24 and the ground paths 26 which are made equal so that the spacings are uniform.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

I claim:

1. A transmission line for an electrical signal comprising a plurality of signal-carrying conductors having parallel edges disposed on one side of a strip of dielectric material, each of said conductors being spaced apart from each other across said strip by a spacing W between adjacent edges, a plurality of ground-plane conductors having parallel edges disposed parallel to said signal-carrying conductors and arranged on the opposite side of said strip in staggered relation with respect to said signal-carrying conductors such that each of said ground-plane conductors occupies a position corresponding to a location of one of said spacings between adjacent signal-carrying conductors, wherein the edges of each of the signal-carrying conductors are substantially congruent with the respective edges of the ground-plane conductors occupying said spacings on either side of each of said signal-carrying conductors.

2. The transmission line of claim 1 wherein each of said signal carrying conductors has a width W as measured between said parallel edges of each of said signal-carrying conductors.

3. The transmission line of claim 2 wherein each of said signal-carrying conductors and each of said ground-plane conductors has a square cross-sectional area equal to $W^2$.

* * * * *